United States Patent
Hathaway et al.

(10) Patent No.: US 6,795,951 B2
(45) Date of Patent: Sep. 21, 2004

(54) METHOD AND SYSTEM FOR FAULT-TOLERANT STATIC TIMING ANALYSIS

(75) Inventors: David James Hathaway, Underhill Center, VT (US); Peter James Osler, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 589 days.

(21) Appl. No.: 09/780,558

(22) Filed: Feb. 9, 2001

(65) Prior Publication Data

US 2002/0112195 A1 Aug. 15, 2002

(51) Int. Cl.[7] .............................................. G08F 17/50
(52) U.S. Cl. ................................ 716/5; 716/1; 716/6
(58) Field of Search .............................. 416/1, 4, 5–8, 416/13, 18; 714/761, 4; 713/500; 705/9; 703/2, 19, 14; 359/245; 347/12; 345/440; 257/481

(56) References Cited

U.S. PATENT DOCUMENTS

| | | | |
|---|---|---|---|
| 4,263,651 A | | 4/1981 | Donath et al. |
| 4,924,430 A | | 5/1990 | Zasio et al. |
| 5,365,463 A | | 11/1994 | Donath et al. |
| 5,508,937 A | * | 4/1996 | Abato et al. .................. 716/6 |
| 5,579,510 A | | 11/1996 | Wang et al. |
| 5,636,372 A | | 6/1997 | Hathaway et al. |
| 5,648,909 A | | 7/1997 | Biro et al. |
| 5,771,375 A | | 6/1998 | Mains |
| 6,023,568 A | | 2/2000 | Segal |
| 6,292,924 B1 | * | 9/2001 | Pavisic et al. .................. 716/1 |
| 6,334,205 B1 | * | 12/2001 | Iyer et al. ...................... 716/7 |
| 6,449,756 B1 | * | 9/2002 | Malik et al. .................... 716/6 |
| 6,463,572 B1 | * | 10/2002 | Pavisic et al. .................. 716/5 |
| 2002/0166101 A1 | * | 11/2002 | Casavant ....................... 716/6 |

FOREIGN PATENT DOCUMENTS

EP 429080 A * 1/2000 .......... H03K/00/00

OTHER PUBLICATIONS

Belkhale et al., "Timing analysis with known false sub graphs", Nov. 1995. Computer–Aided Design, 1995, ICCAD–95. Digest of Technical Papers., 1995 IEEE/ACM International Conference on , Page(s): 739–739.*
Goldberg et al., "Timing analysis with implicitly specified false paths", Jan. 3–7, 2000, VLSI Design, 2000. Thirteenth International Conference on, Page(s): 518–522.*
Sherman et al., "Algorithms for timing requirement analysis and generation", Jun. 12–15, 1988, Design Automation Conference, 1988. Proceedings., 25t ACM/IEEE, Page(s): 724–727.*
Research Disclosure, "Special–Purpose Data Model for Static Timing Analysis", Jan. 2000, 429080, p. 95.
IBM Microelectronics, "The Hidden Benefits of IBM", vol. 6, No. 3, Aug. 2000, pp. 1–6.

* cited by examiner

Primary Examiner—Vuthe Siek
Assistant Examiner—Helen Rossoshek
(74) Attorney, Agent, or Firm—Richard M. Kotulak, Esq.; McGinn & Gibb, PLLC

(57) ABSTRACT

A method and system for performing fault tolerant static timing analysis for an electronic network. A composite timing graph is generated by making K+1 copies of the zero-defect timing graph of the network, where K is a predetermined maximum number of defects present on a path of the network, and static timing analysis is performed on the composite timing graph.

22 Claims, 5 Drawing Sheets

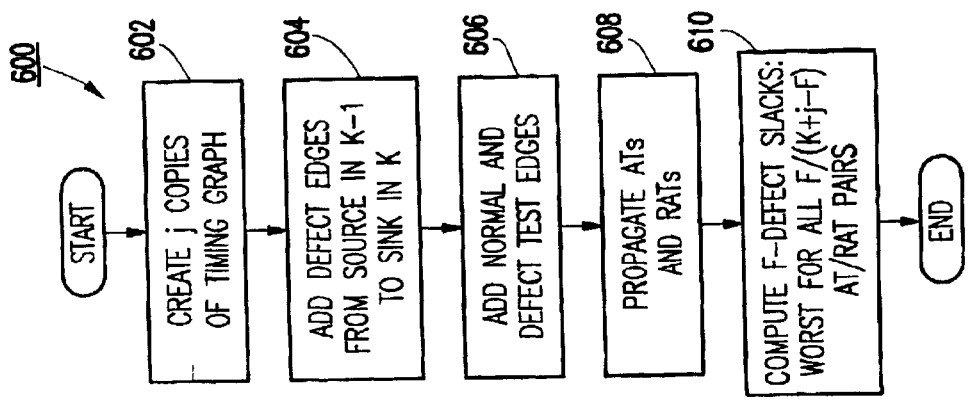
FIG. 6
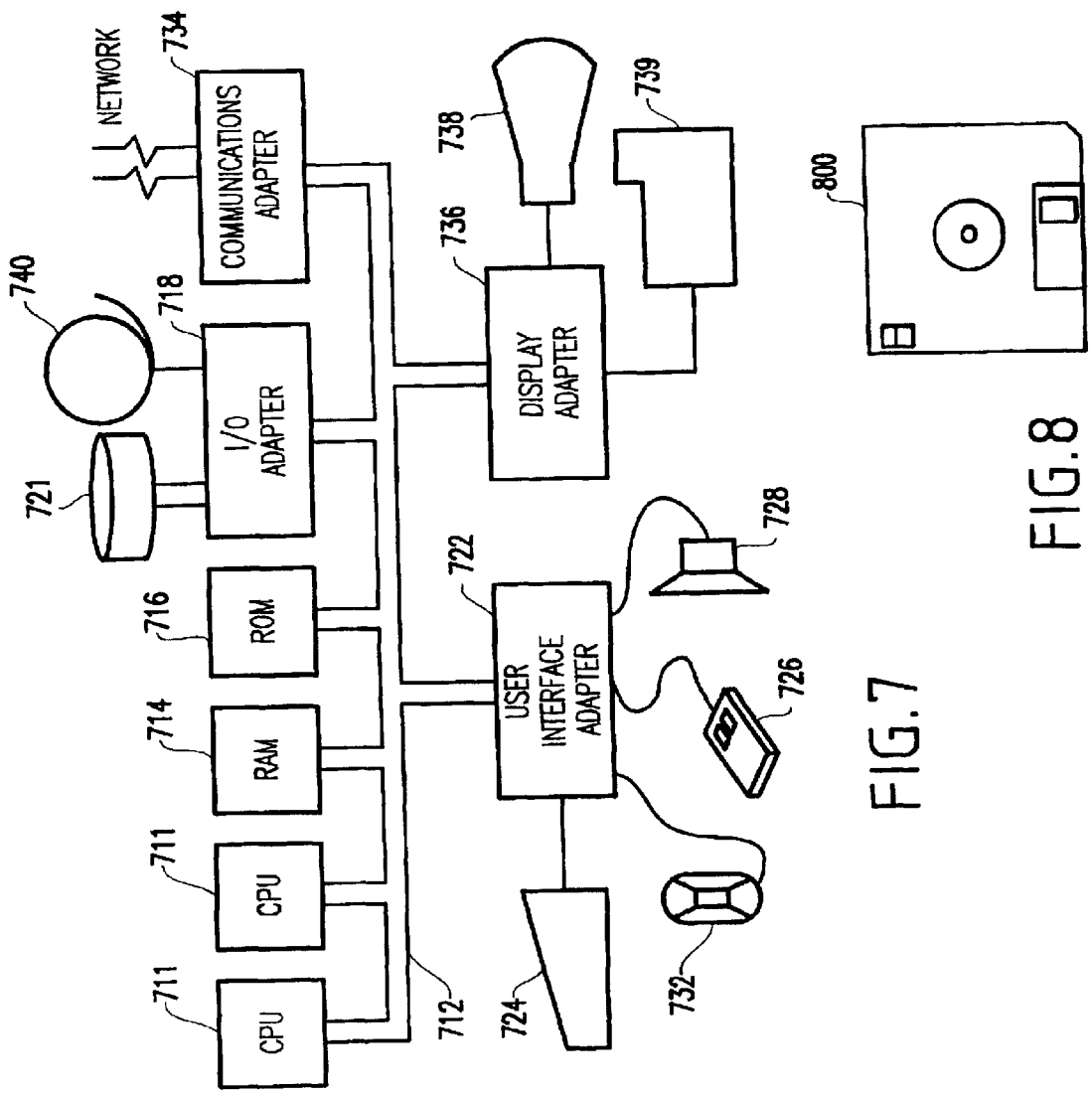
FIG. 7
FIG. 8

METHOD AND SYSTEM FOR FAULT-TOLERANT STATIC TIMING ANALYSIS

BACKGROUND OF THE INVENTION

1. Field of the Invention

The present invention relates generally to timing analysis of logic networks to determine whether the system will meet timing requirements for all possible combinations of inputs and internal states. The technique disclosed herein offers a new tool for circuit design by including in the timing analysis time delay shifts due to such factors as manufacturing abnormalities not serious enough to cause a hard failure, conductor coupling, or floating component elements in newer technologies such as SOI.

2. Description of the Related Art

Traditional static timing analysis methods, such as one based on the graph shown in FIG. 1, attempt to determine whether a logic network will meet a set of timing requirements for all possible combinations of input and state information. The timing is computed based on a smooth distribution of delays in the network and assumes that all these elements are operating as designed and are free from defects which would alter their delays. This presumption is not always realistic.

Presently, there is no adequate technique for analyzing delays due to such factors as low probability coupling between adjacent signal lines within a circuit, or due to manufacturing steps that are imperfect but not so serious as to cause an outright failure. Such manufacturing imperfections, or defects, may occur due to effects in newer technologies such as partially-depleted silicon-on-insulator (PD-SOI) where elements such as the bodies of transistors are floating rather than being electrically connected to any other node or the chip substrate. Changes in the voltage of such floating elements cause changes in threshold voltages, which in turn cause shifts in circuit delays. A class of defects is suspected of causing these floating elements to have higher leakage current, which can shift the balance of body currents and thereby shift the body voltage and the circuit delays. Newer technologies such as partially-depleted silicon-on-insulator (PD-SOI) have floating elements susceptible to such defects. This type of delay defect may have been present in older bulk technologies, but because such technologies did not have floating body elements, did not cause sufficient delay shifts to be noticeable. Thus, conventional static timing analysis techniques do not account for such circuit delay shifts except in very simplistic ways. Moreover, there has been no tool that can help a designer in such situations to isolate timing bottlenecks due to such delay shifts and make design decisions before circuit fabrication.

Delays in a logic network may not be exactly knowable, due to variations in the manufacture of the integrated circuit(s) in which the logic network is implemented, and due to various details of the design which, though theoretically predictable, are ignored (due to processing time limitations or inadequate modeling) in delay calculations. These variations tend to affect all delay edges in the network in a statistical manner. Many methods have been developed to account for such variations and/or the correlations between them, including Monte Carlo analysis, a method disclosed by Zaslo et al. in U.S. Pat. No. 4,924,430 which determines narrow distributions for the delays on a single chip from a wider distribution for the delays all instances of the chip, statistical summing of delays through propagation of mean and sigma ATs as was used in ETE, an early IBM static timing analyzer, the "linear combination of delays" (LCD) method, described by Dreibelbis et al. in an article titled "The Hidden Benefits of IBM ASICs: Part 1" which appeared in MicroNews, vol. 6, no. 3, published in 2000 by IBM Microelectronics, and used in EinsTimer, a static timing analyzer currently used by IBM, and the common-path pessimism removal (CPPR) method used in EinsTimer and described by Hathaway et al. in U.S. Pat. No. 5,636,372.

Defects in the circuit comprising a logic network can also cause variations in the delays of the network. In the past most defects which affected delays were likely to reduce the reliability of the network, and there was therefore no incentive to accommodate them in static timing analysis. Instead efforts were made to detect them in manufacturing test to avoid shipping unreliable parts. Examples of such faults are high resistance connections due to narrowed conductors or incompletely filled vias.

FIG. 2 shows a generalized distribution 20 of the types of circuit element delay variations accounted for by the conventional timing analysis techniques. The distribution for one delay edge is shown. Delay is shown along the horizontal axis, and the probability of the edge taking on a particular delay values is shown on the vertical axis. Conventional methods assume delays vary according to some smooth distribution, so a composite analysis can be a linear combination of delays using parameters such as propagation mean values and sigma ATs. Thus, conventional methods assume a delay distribution having a single peak.

With the introduction of partially-depleted of silicon-on-insulator (PD-SOI) technology it appears that there may be a class of defects which affects circuit delay but which does not otherwise affect the reliability or functioning of the circuit. This problem is not addressed by the above-described conventional technique. In PD-SOI devices the body of the transistor (the region in which the conductive channel forms) is typically floating (not electrically connected to any other node), unlike bulk technologies in which the device body is tied to the substrate (for NFETs) or to the Nwell (for PFETs). As a result, the body voltage will vary depending on the past history of the device, the exact value depending on the balance of source and drain junction diode currents, impact ionization current, and capacitive coupling. This body voltage variation causes a shift in the threshold voltage of the transistors, which in turn causes a variation in the circuit delays.

It appears that there may be a class of process defect which causes increased leakage of the source and drain diode junctions in a device. Such defects may have been present in past bulk technologies, but because the change in leakage caused is very small, and because the device bodies in these technologies were tied to ground (for NFETs) or Vdd (for PFETs), they would have had a negligible effect on device performance. In PD-SOI technologies, however, such increased leakage could shift the balance of body currents in a device, affecting the body voltage of the device and hence the delay of the circuit. Like other defects which induce delay variation, this is a very rare event and hence the probability that such a defect occurs more than once on any given path is negligible. However the probability that it would occur somewhere on a chip could be significant (there is speculation that perhaps one fourth of all chips exhibit such defects). Unlike other defects which induce delay variation, this appears to be a benign defect, in the sense that it does not worsen over the life of the chip, and hence does not affect the long term reliability of the chip.

A third type of time delay shift is one caused by coupling. As conductors on chips get closer together, the coupling between parallel sections becomes tighter. Typically, under normal operation this tighter coupling does not present a problem, but with ever tighter pitches between conductors, the chance becomes greater for significant shifts in time delay due to coupling between simultaneously transitioning conductors. Techniques are known in the art to compute the delay shift due to such coupling when it occurs, but because the exact alignment of transitions in adjacent conductors is rare, it is pessimistic to assume that all pairs of adjacent conductors always exhibit such a delay shift. The conventional techniques do not fully address the problems with infrequently occurring coupling delays.

FIG. 3 shows a distribution 30 of circuit element delay variations as modified to be a bimodal distribution having a primary peak 32 on the left plus a smaller secondary peak 34 offset on the right. This bimodal distribution represents a conventional distribution modified to include at least one infrequent (secondary) delay peak 34 isolated from the smooth (primary)peak of the distribution. The smaller peak on the right is the result of the type of delay shifts described above, or of some other characteristic of or influence on elements of a logic network which can, with low probability, cause a shift in the delay of elements in the logic network.

SUMMARY OF THE INVENTION

In view of the foregoing problems, it is, therefore, an object of the present invention to provide a method to analyze timing for a logic network in which defects or faults causing shifts in circuit delays are taken into account.

It is another object of the invention to allow timing bottlenecks in a circuit to be identified and properly modified prior to fabrication.

It is another object of the present invention to provide a method to analyze an arbitrary number of defect delay shifts for a logic network, where the arbitrary number is a preselected small finite number.

It is another object of the present invention to allow analysis for timing shifts due to such factors as conductor coupling, imperfect manufacturing processes, or changes in floating elements that occur only infrequently or under only a certain combination of switching conditions, or whose result cause time delays that may or may not cause a hard failure.

It is another object of the present invention to provide an augmented timing graph that uses a conventional timing graph based on zero defects as the starting point.

It is another object of the invention to provide a method in which a zero defect timing graph is copied and each copy becomes the basis for the timing analysis of an additional assumed defect.

It is another object of the invention to provide a timing analysis method in which multiple faults with different probabilities can be analyzed.

It is another object of the invention to allow a timing safety margin to be determined for each node, wherein such timing safety margin becomes a measurement of how potential design modification options can be compared.

It is another object of the invention to allow timing analysis of a highly bimodal distribution of circuit delays in a path in which a primary mode is represented as a smooth distribution of delays and a secondary mode is represented as a small but significant spike that is offset a known distance from the primary mode.

It is another object of the invention to provide different slack values for various number of defect delay shifts, so that a circuit designer can select modifications based upon which slack value would be optimized.

It is another object of the invention to provide an alternative to conventional "guard banding" methods which assume a simplistic worst-case delay for all paths.

It is another object of the invention to provide a method in which time delay due to the propagated effects of defect-induced changes in slew rate can be analyzed.

It is another object of the invention to provide a method in which time delay shifts can be analyzed in applications outside electronic networks.

The present invention can be briefly summarized by the following steps:

1. Create a composite timing graph composed of K+1 copies of the normal timing graph for a logic network, numbered 0 through K, where K is the maximum number of defects expected in a path.
2. For each delay edge E in the original timing graph which is susceptible to a defect, add defect edges whose delay reflects the behavior of the circuit element whose representation includes the delay edge in the presence of a defect between source nodes of E and sink nodes of E in different copies of the timing graph.
3. Perform a conventional static timing analysis on the composite timing graph, where ATs (and optionally, slacks and RATs) on nodes in various copies of the timing graph reflect the limiting behavior of the logic network in the presence of defects along paths through the node.

The present invention assumes as a practical matter that the secondary peak in the bimodal distribution of FIG. 3 occurs a significant but bounded distance from the primary mode and that it is small, that is, it occurs very infrequently, and thus will occur at most once or a small number of times in any path. However, the basic technique remains valid regardless of practical assumptions. Because these types of defect may cause a significant shift in circuit delay but may occur only rarely, past methods for modeling delay variation in static timing analysis are inadequate for modeling the effects of such defects. This invention provides an efficient way of doing so.

BRIEF DESCRIPTION OF THE DRAWINGS

The foregoing and other objects, aspects and advantages will be better understood from the following detailed description of a preferred embodiment of the invention with reference to the drawings, in which:

FIG. 6 is a flowchart illustrating a preferred embodiment of the invention in the case of the timing analysis of j faults per path;

FIG. 7 illustrates an exemplary hardware/information handling system 700 for incorporating the present invention therein; and FIG. 8 illustrates a signal bearing medium 800 (e.g., storage medium) for storing steps of a program of a method according to the present invention.

DETAILED DESCRIPTION OF PREFERRED EMBODIMENTS OF THE INVENTION

Figure 1:
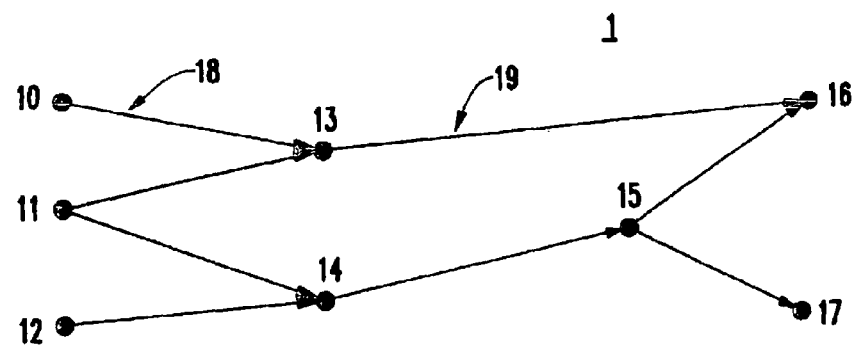
FIG. 1 illustrates a conventional static timing analysis graph.
Figure 2:
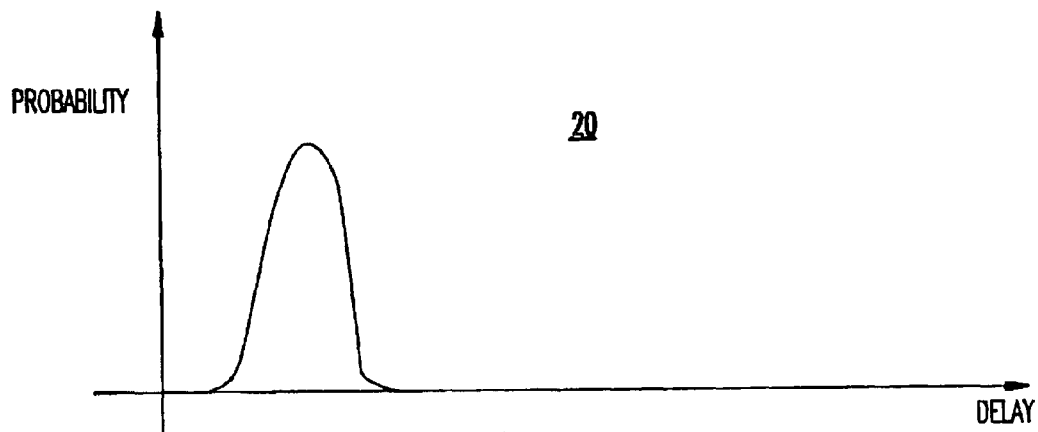
FIG. 2 shows a generalized distribution of delay variations presumed by conventional timing analysis techniques.
Figure 3:
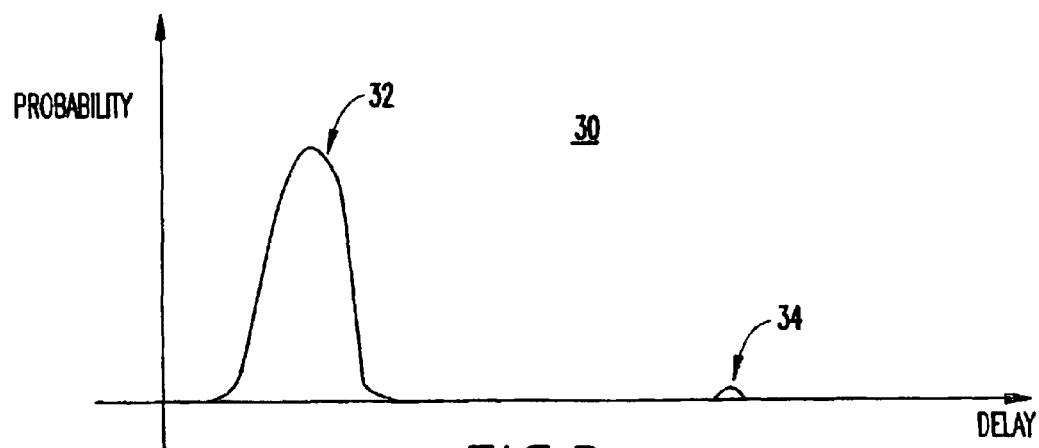
FIG. 3 shows a modified generalized distribution of delay variations in which infrequent defects cause an isolated peak in the conventional distribution curve (bimodal distribution)

To further explain the problems of the conventional technology, a timing graph 1 is shown in FIG. 1 for an arbitrary network composed of nodes 10–17. The network might be a simple single element such as a NAND gate or could be composed of millions of elements as commonly found on current chip designs. The techniques disclosed herein apply regardless of number of nodes in the network. An actual application would typically involve millions of nodes and would be implemented by a computer program.

Nodes 10–12 in FIG. 1 are input nodes, and nodes 16 and 17 are output nodes. Internal nodes 13–15 might represent internal points within an element, or might represent points of a circuit where elements interconnect. Edges 18,19 are associated with ordered node pairs, exemplified in FIG. 1 by edge 18 for nodes 10 (source node) and 13 (sink node) and edge 19 for nodes 13 and 16. A path is a series of edges followed in the direction indicated by the arrows between points of interest. Edges 18 and 19 combine to form path 10–13–16 between input 10 and output 16.

The network represented by the timing graph shown in FIG. 1 is assumed to be "acyclic", meaning that no loops exist that are not broken by clocked latch elements. In other words, all paths within the network that can be traced back to their origins have at least one clocked latch element somewhere in the loop.

Considering a simple acyclic combinational logic network, a conventional static timing analyzer, as originally described by Donath et al. in U.S. Pat. No. 4,263,651, treats the logic network as a directed acyclic graph, with minimum and maximum delays on each edge, and with late and early mode arrival times (ATs), and optionally late and early mode required arrival times (RATs) on each node. The late mode AT of a node represents latest time within a clock cycle that the signal represented by the node can achieve a final stable value. The early mode AT of a node represents the earliest time within a clock cycle that the signal represented by the node can become unstable, i.e., the earliest that it can change from the final stable value achieved during the previous clock cycle. For an acyclic combinational logic design (one containing no latches) to satisfy the timing requirement imposed upon it, the late mode AT at each network output must not exceed the late mode RAT for the output, and the early mode RAT at each network output must not exceed the early mode AT for the output. If RATs are computed at internal nodes of the timing graph as well, the same condition must hold at all nodes in the timing graph. If the logic network contains clocked latch elements, each latch imposes two additional conditions that must be met.

A "set up test" measures whether data has arrived at the latch by the time the capture clock pulse arrives. A "hold test" measures whether data remains stable at the node after the capture clock pulse. When RATs are computed at internal nodes of the timing graph, they may be defined to include these constraints. "Slack" is a numerical measure of the success of the timing requirements. Positive slack indicates adequate timing and the numerical value indicates the margin of success. Negative slack indicates a timing failure and the numerical value indicates the degree of missing the condition. A negative slack on a node in late mode indicates that the AT for the node exceeds the RAT, and in early mode indicates that the RAT for the node exceeds the AT. This computation of a single AT (RAT) value for each node in terms of the ATs (RATs) of the immediate predecessors (successors) of the node and the delays of the edges between the node and those predecessors (successors) is often called "block-oriented" timing analysis, and its run time is linear with the size (number of edges in) of the logic network. It is preferable to an alternative method which separately traces and computes the delays of all paths through a logic network because the number of such paths may be exponential in the size of the network.

A simplistic way to consider AT, RAT, and slack is to recognize that an AT is calculated moving left to right (e.g., from network inputs to outputs). A RAT is calculated moving right to left (e.g., from network outputs to inputs). The two are combined by taking the difference to produce slack.

Often delays in a logic network are affected by the input waveform to a circuit element (e.g., the slew of the signal). The output waveform of the circuit element is typically computed along with the AT, with the waveform chosen typically being either the one propagated along the edge which produced the extreme (maximum for late mode and minimum for early mode) AT, or, of all waveforms propagated to the node, the one with the most extreme characteristics (e.g., the fastest or slowest rise time). This waveform is itself affected by the same kinds of loading and input waveform which affect the delay on an edge, and thus variations which affect the delay of an edge in the network may propagate in the form of waveform variations to affect delays in the output cone fed by the sink of the edge. The late (early) mode AT of a node is the maximum (minimum) over all edges feeding the node of the late (early) mode AT at the edge source plus the maximum (minimum) delay on the edge. If RATs are computed, the late (early) mode RAT of a node is the minimum (maximum) over all edges fed by the node of the late (early) mode AT at the edge sink minus the maximum (minimum) delay on the edge. A timing graph may also include test edges which require that the late mode AT at one end of the test edge precede the early mode AT at the other end by some amount. In this manner a late (early) mode AT at one end of the test edge may contribute to the early (late) mode RAT at the other end of the edge. Setup tests, hold tests, and other timing tests can be modeled in this manner, depending on which nodes the edge connects and which end is required to precede the other. For example, the late mode RAT at the data end of a test edge is the maximum of the normal late mode RAT due to out-going delay edges and the early mode AT at the clock end of the test minus the setup time. A slack value is often defined at each node as RAT-AT for late mode (AT-RAT for early mode), such that a negative slack indicates that the signal stabilizes (becomes unstable) too late (early) at the node. One can further define a slack on a delay edge as RAT (edge-sink)–delay (edge)–AT (edge-source) for late mode (AT(edge-source)+delay (edge)–RAT(edge-sink) for early mode).

Thus, obtaining non-negative slack throughout the logic network is an objective of the design process, a process guided by static timing analysis results.

Referring now to FIGS. 4–8, the invention will be described. The invention can be explained in the environment of FIG. 1 which shows a timing graph for a network composed of nodes 10–17.

Figure 4A:
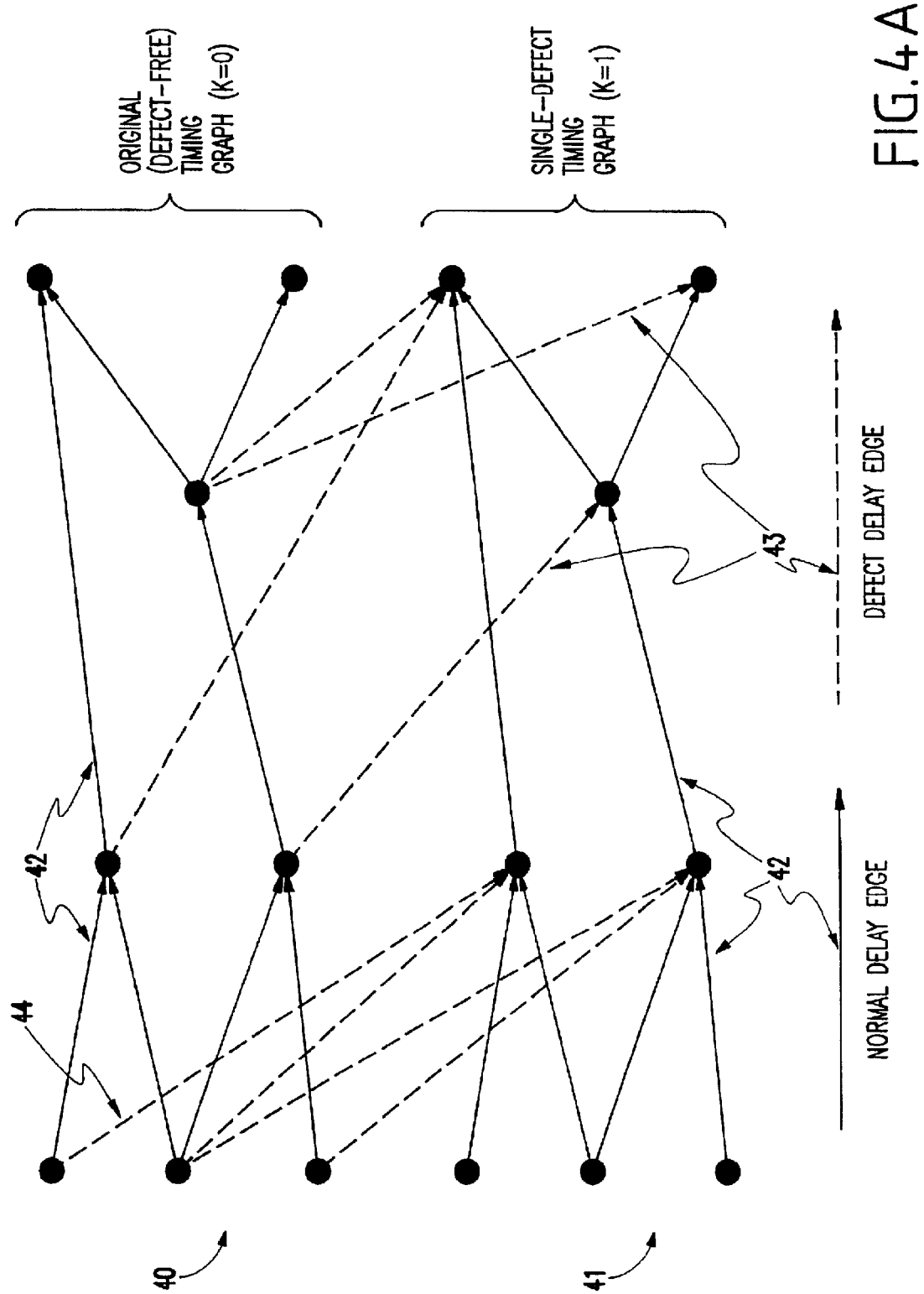
FIG. 4a demonstrates a composite timing graph used in a method of the invention.

FIG. 4a presents the technique of the invention and illustrates the case for a single defect (K=1) or time delay shift. An original timing graph 40 is first generated, which is the same as graph 1 shown in FIG. 1, and which represents the network timing analysis with zero defects (K=0), as is done in conventional methods. A copy 41 of the original timing graph is then placed below the original graph, which copy 41 becomes the basis for the analysis with a single defect (K=1). Normal delay edges 42 (solid lines) are plotted in both copies. Dashed lines 43 are added to represent single-defect delay edges interconnecting the zero-defect and single-defect graphs. In the present specification, any delay shift is loosely called a "defect" or "fault", even though the source of the shift is not necessarily a defect in the normal sense. Stated slightly differently, in the context of this invention, the terms "defect" and "fault" should be understood to represent any effect which causes, with low probability, a variation in the delay value on an edge in the timing graph.

The timing graph is augmented for each additional possible defect in a path by adding one additional copy of the original graph at the bottom of the composite graph and adding interconnecting defect delay edges to the latest copy. Thus, for a two-defect diagram (K=2, not shown) a second copy of the original timing graph 40 would be added below the single-defect graph 41 and defect delay edges between the K=1 graph and the newly added K=2 graph are added. Continuing in this same manner, a composite timing graph can be generated for an arbitrary number j of defects, adding j copies of the original timing graph 40 and introducing j sets of defect delay edges interconnecting the copies. Although the invention is described as creating copies of the timing graph, in practice one would more likely create a single data structure for each node and edge in the original timing graph, on which are stored multiple pieces of information corresponding to the separate conceptual timing graph copies. For example, one might associate an array with each node and edge in the network, and store AT, RAT, and/or slack values associated with different numbers of faults in different positions within the node arrays, and store normal and defect delay values in different positions in the edge arrays. The essential equivalence of these alternative implementations will be understood by one skilled in the art.

Returning back to the defects discussed above, if these types of defects had an equal maximum increase (decrease) in the maximum (minimum) delay (called "dD") of any circuit in which they were present, one way to model them would be by providing a late (early) mode slack margin of dD at all latches and primary outputs, i.e., to attempt to design the circuit so that all signals stabilize (become unstable) dD earlier (later) than would be required in the absence of the defect. However, it is highly unlikely that the delay effect of the defect is the same for all circuits. Note that various types of defects may cause the delay of an edge to be either faster or slower than in the defect-free case, and the delay increase for an edge (for late mode) and the delay decrease (dD) for the edge (for early mode) may be different.

One could also perform a conventional static timing analysis and then trace back along the path which caused the AT at the path endpoint, find the maximum dDmax for any edge on that path, and require the a positive slack of dDmax at the endpoint. However, this technique has problems similar to those which can occur in CPPR, in that a second path feeding a node might have been extremely close to causing the AT at the node, but might have a much larger dD2 on some edge in the path feeding it, such that this path second path would require a larger defect-tolerance margin.

Both of these methods are also deficient in the case of delay models in which the delay of a circuit element is dependent on propagated effects from upstream delay edges, such as when the delay and slew of a delay edge depend on the slew of the input signal. In this case the mechanism causing a delay shift on a delay edge may also cause a shift in slew, causing additional delay shifts in downstream delay edges, and the resultant cumulative delay shift is difficult to estimate.

Yet another alternative analysis method would trace each path through the network and determine the path delay for each possible location (or in the case of multiple defect analysis, sets of locations) in which a defect delay edge could occur. The longest path found would then be reported, and the slack at each node or edge would be the longest path traced through the node or edge. This method, while accurate, would be extremely inefficient, since, as described above, the number of paths through a network can be exponential in the size of the network, and for each path of length L, we must consider $L!/(j!(L-j)!)$ different sets of locations for j defect edges.

The present invention avoid the deficiencies of these methods by constructing and performing conventional block-oriented static timing analysis on the composite timing graph described above. This composite timing graph contains no path that includes more than j defect edges, and contains all possible paths which include up to j defect edges. Thus it can be used to achieve our goal of determining the network timing characteristics in the presence of j or fewer defects. Since this composite timing graph grows linearly with j (the number of defects being considered), the overall performance of the method grows linearly with j, while retaining the linear performance relative to the network size which is characteristic of block-oriented static timing analysis.

The composite timing graph is constructed as shown in FIG. 4a. For each delay edge 42 in the original timing graph 40 which is susceptible to a defect, j defect edges are inserted, such that, for each K<=j, there is a defect edge 43 from the copy in graph K−1 of the source node of the edge in the original timing graph to the copy in graph K of the sink node of the edge in the original timing graph. For example, delay edge 44 in FIG. 4a is a copy of delay edge 18 in the original timing graph 1 in FIG. 1. Thus an original timing graph contains N nodes and E edges, all delay edges in the timing graph are susceptible to defects, and we are considering a maximum of K defects per path, the composite timing graph will contain (j+1)*N nodes and (2j+1)*E edges, of which (j+1)*E are normal delay edges and j*E are defect edges.

The timing analysis of the composite timing graph in this case begins as for a normal timing graph; ATs are propagated forward through all edges and RATs (if they are being used) are propagated backward through all edges. Thus the ATs on the nodes of any graph K will be the extreme (maximum for late mode and minimum for early mode) signal arrival times at the corresponding nodes in the original timing graph under the condition that at most K edges in the fanin cone of the node exhibit a defect. For K=0 these are the same as the ATs from the original timing graph. The worst j-defect AT for a node may then be found by looking at the copy of the node in the K=j graph.

In the case that the delay model depends on propagated effects from upstream edges, such as when the delay and slew of a delay edge depend on the slew of the input signal, the RATs on the nodes of any graph K will be the extreme (minimum for late mode and maximum for early mode) RATs on the corresponding nodes of the original timing graph under the condition that at most j-K edges in the fanout cone of the node exhibits a defect, and all delays in the fanout cone of the node are influenced by the propagated effects of at most K defective delay edges. None of these RATs are exactly the same as the RATs in the original timing graph. In this case the worst j-defect RAT may be found by looking at the copy of the node in the K=0 graph. The worst j-defect slack for the node can be found by taking the worst value over all 0<=K<=j of the slack of the copy of the node in graph K. In this case (when delay model depends on propagated effects from upstream edges), each copy K of the original timing graph can be used to compute ATs on nodes for paths to the node having up to K defects. The RATs and slacks computed from the composite timing graph, however, are valid only for a single value of j. Thus if normal (defect-free) RATs and/or slacks are desired, the composite timing graph must be built in addition to the original (defect-free) timing graph.

In the case where the delay model used does not depend on propagated effects from upstream edges the ATs have the same meaning as above, but RATs on the nodes of any graph K will be the extreme (minimum for late mode and maximum for early mode) RATs on the corresponding nodes of the original timing graph under the condition that at most j-K edges in the fanout cone of the node exhibits a defect. In this case the RATs on nodes of graph j are the same defect-free values as those on the corresponding nodes of the original timing graph. Thus a single j-component composite timing graph may be used to compute separate ATs, RATs, and slacks for a node under the assumption that paths through the node contain different numbers of defects K, where 0<=K<=j. The x-defect slack for a node is found by combining (i.e., RAT-AT for late mode and AT-RAT for early mode) the AT for the copy of the node in graph y and the RAT for the copy of the node in graph z for all pairs of values y and z such that y+j−z=x, and taking the worst of the results. For example, if j=3 and x=3, the late mode slack is the minimum of $RAT_0-AT_0$, $RAT_1-AT_1$, $RAT_2-AT_2$, and $RAT_3-AT_3$. The zero-defect slack (that which would have been obtained from the original timing graph) in this case would simply be $RAT_3-AT_0$. The single-defect slack would be the minimum of $RAT_3-AT_1$ and $RAT_2-AT_0$.

Figure 5A:
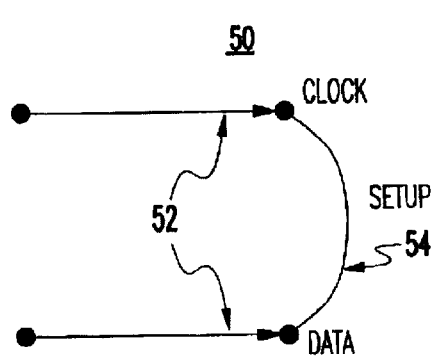
FIG. 5a illustrates a test edge used in conventional static timing analysis.
Figure 5B:
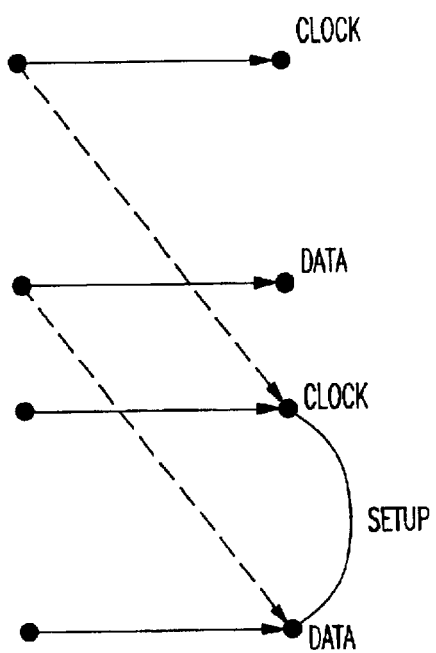
FIG. 5b illustrates a test edge used in the method of the invention under a first set of constraints on the total defects in the clock and data paths to a test.
Figure 5C:
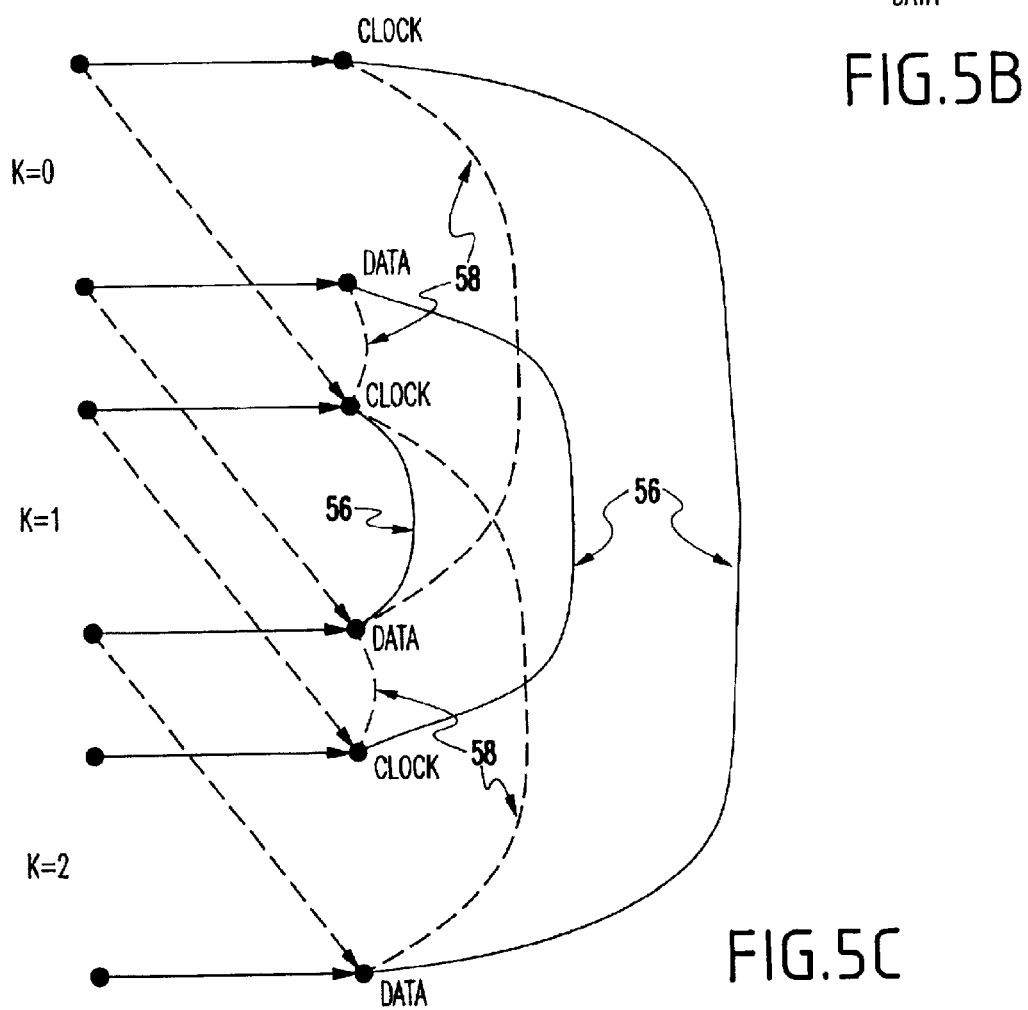
FIG. 5c illustrates normal and defect test edges used in the method of the invention under a second set of constraints on the total defects in the clock and data paths to a test.

Test edges may also be incorporated into the composite timing graph. FIG. 5a shows a simple timing graph 50 containing two delay edges 52 and one test edge 54 which will be used as an example. One may choose to allow a maximum of j defects on both the path to the clock end of the test edge and on the path to the data end of the test edge (a total of 2j defects on these two paths). In this case we will include normal test edges in copy K=j of the delay graph (we may also include them the other copies, although the worst slack will always be seen on the tests in copy K=j). These test edges will contribute to the computation of the RATs at both of their ends, as in normal timing analysis. FIG. 5b shows a composite timing graph for the timing graph of FIG. 5a in which test edges are handled in this manner, where j=1. More generally, one may choose to allow a total of x defects (j<=x<=2j) on the combined paths to the clock and data ends of the test edge. In this case we will include normal test edges between all pairs of copies of endpoint nodes in models K=y and K=z such that y+z=x. One may also choose to represent possible defects on test edges themselves, where the total number of defects on both paths plus the test edge is x. In this case we will also include defect test edges between all pairs of copies of endpoint nodes in models K=y and K=z such that y+z+1=x. FIG. 5c shows a composite timing graph for the timing graph of FIG. 5a in which test edges are handled in this manner, where j=2 and x=2, with normal test edges 56 and defect test edges 58. Note that when y does not equal z, we need to include both a test edge from the clock node in copy K=y to the data node in copy K=z and a test edge from the clock node in copy K=z to the data node in copy K=y. If, in the case where the delay model used does not depend on propagated effects from upstream edges, we wish to maintain the ability to use a single j-component composite timing graph to compute separate ATs, RATs, and slacks for a node under the assumption that paths through the node include different numbers of defects K, where 0<=K<=j, we must constrain x, the total number of defects allowed on the combined paths to the clock and data ends of the test, to be equal to j.

A designer could use this analysis in many ways, such as trying to get non-negative j-defect slacks at all points in the composite timing graph. Or if this was too expensive or difficult, the designer might try to minimize the number of nodes in the timing graph which have negative single-defect slacks, thus minimizing the probability that a single defect could cause a timing error in the network.

Considerable additional design information is added even for the simple case of a single defect analysis (K=1). Two sets of slacks will be computed. The first set, for K=0, is the conventional defect-free slack. As in the past, the designer will want to get all these slacks positive to ensure that the circuit will meet timing requirements assuming zero defects. She will want to additionally get as many of the single-defect slacks positive as possible since, if most are positive, then the probability is improved that timing requirements will be met even if a defect does occur. Any negative single-defect slacks would mean that, if a defect does occur, the chip may not then meet timing requirements.

Although this has been proposed as a means of accommodating specific types of defects which appear to occur in PD-SOI, or unlikely coupling events between adjacent conductors, it could be used to accommodate any type of defect which affects delays of individual edges in a timing graph, but which does not otherwise affect the chip reliability or prevent the use of the chip.

The correct manufacture and reliability of integrated circuits, or chips, is verified by a set of manufacturing tests applied to each chip produced, or to a sampling of those chips. Manufacturing tests are usually broken down into two categories, DC tests and AC tests, a categorization analogous to the two broad types of electrical signals. In a DC test, an input signal is applied to the circuit under test and the signals at preselected test points are measured a predetermined time interval later to determine whether the correct values have been generated. The time interval is long enough to permit transients to settle, typically several cycles of the system clock. This type of test detects whether a component such as a NAND gate fails to perform its intended function, but would not detect that the NAND gate has a slow response time.

By using a shorter time interval typically less than a system clock period, an AC test observes the circuit reaction during transients. A launch clock initiates the application of a test vector to a portion of the circuit, and one or more "capture" clock signals are used to capture in storage elements the output of the portion of the circuit a fixed time intervals later. These results can then be scanned out of the chip via shift registers or otherwise examined to determine whether or not the portion of the circuit produced the correct results in the expected time. Because some defects which affect chip speed can also cause reliability problems, these AC tests can be used both to verify circuit performance and to screen out reliability problems.

For maximum utility one would need to provide some means other than AC test to eliminate other classes of delay-affecting defects which do affect the chip reliability or prevent the use of the chip. For example, one might measure the change in delay degradation after burn-in.

Figure 4B:
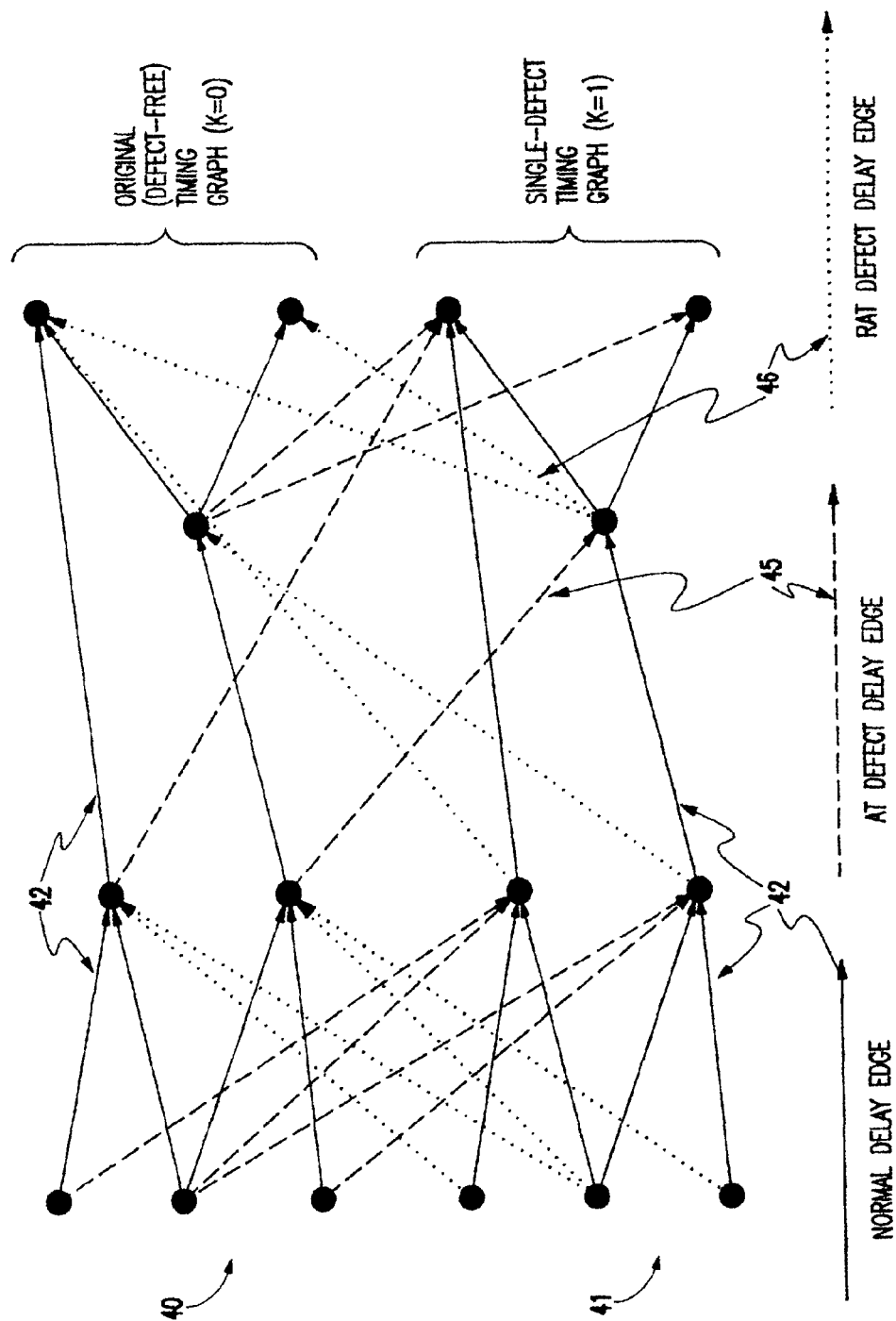
FIG. 4b demonstrates an alternative composite timing graph used in a method of the invention.

As mentioned previously, a modification to the first embodiment would be to develop a single timing graph (to avoid duplicating connectivity information) and would store multiple ATs, RATs, and delays on the various nodes and edges. This modification would likely be preferred when the technique is implemented by a computer program. Another alternative would be to store all K-defect ATs and RATs on the same component of the composite timing graph, rather than having the K-defect AT stored with the (j-K)-defect RAT as in the first embodiment described above. In this case separate AT and RAT propagation defect edges would be required, as shown in FIG. 4b. AT propagation defect edges 45 would be constructed as were defect edges 43 in FIG. 4a, described in the first embodiment. Only AT information would be propagated through these edges. RAT propagation defect edges 46 would be constructed for each delay edge 42 which is susceptible to defects, for all K<j, from the copy of the source node of the edge in graph K+1 to the copy of the sink node in graph K. Only RAT information would be propagated through these edges. An x-defect slack would be computed for a node by combining the AT from the copy of the node in graph y with the RAT for the copy of the node in graph z for all pairs of y and z values such that y+z=x. The essential equivalence of these and other embodiments will be recognized by one skilled in the art.

Coupled noise is another form of delay variation which might benefit from this type of analysis. Currently static timing analysis typically either ignores coupling (e.g. assumes no "defects" exist) or assumes coupling could occur simultaneously on all delay edges representing conductors which have significant coupling to other nets (e.g., assume the "defect" count approaches the path length). The former is optimistic and may fail to detect real errors, while the latter is generally pessimistic, since the probability of getting detrimental coupling events along the entire path simultaneously is low. The method of this invention can be used to allow for a predetermined number of "defects" (coupling events) along any path.

FIG. 6 shows the flowchart 600 for the preferred embodiment of the invention for analysis of paths containing up to j defects. In step 602, j timing graph copies containing nodes and delay edges are generated. Let original network be 0, and the K-fault network be K. In step 604 the defect delay edges are added for each graph K from sources in K−1 to sinks in K In step 606 defect-free test edges are added between all pairs of endpoint nodes in graphs y and z such that y+z=j, and defect test edges are added between all pairs of endpoint nodes in graphs y and z such that y+z+1=j. In step 608 ATs and RATs are propagated through the composite timing graph as in normal block-oriented static timing analysis. Finally, in step 610 the slacks are calculated for F faults, using AT's from graph K and RAT's from graph K+j−F. For each node, the slack is the worst for all K, K+j−F pairs.

In the event that not all delay edges in the network are susceptible to defects, there may be portions of the network which are not involved in any path which includes a defect edge. Computing ATs and RATs for each the nodes of each copy of such network portions would be a waste of time and space. Thus one can omit computation and storage for any node in copy K of ATs whose fan-in cone does not contain any path to the node with least K edges susceptible to defects, and of RATs whose fanout cone does not contain any path from the node with at least K edges susceptible to defects. Obviously if neither an AT or RAT is to be computed for a node, that node may be omitted from the composite timing graph. The maximum number of defect-susceptible edges in any path to or from a point can be found by a simple modification of static timing analysis, where the delay for a defect-susceptible edge is one and the delay for every other edge is zero, and the ATs and RATs at all primary inputs and outputs are zero. The modified AT at a node is then the maximum number of defect-susceptible edges on any path to the node, and the negative of the modified RAT at a node is the maximum number of defect-susceptible edges on any path from the node. For slack computation purposes, if the maximum number of delay susceptible edges on any path to a point is Q, the K-defect AT for all K>=Q is equal to the Q-defect AT. Similarly if the maximum number of delay susceptible edges on any path from a point is Q, the K-defect RAT for all K>=Q is equal to the Q-defect RAT.

As a final embodiment, note that multiple types of faults with different probabilities may be allowed, where, for example, fault type one has some probability p1 of occurrence and fault type 2 has some lower probability p2 of occurrence. In this case defect edges for type 2 faults may be introduced between graph K and K+r for r>1, where the probability of having r faults of type 1 in a path is roughly equal to the probability of having a single type 2 fault in the path. Thus the delay associated with a specified number of faults per path becomes the bounding delay for the path with a certain probability. Each copy of the graph introduces a new lower probability with which we may bound the delay of paths in the logic network.

FIG. 7 illustrates a typical hardware configuration of an information handling/computer system in accordance with the invention and which preferably has at least one processor or central processing unit (CPU) 711.

The CPUs 711 are interconnected via a system bus 712 to a random access memory (RAM) 714, read-only memory (ROM) 716, input/output (I/O) adapter 718 (for connecting peripheral devices such as disk units 721 and tape drives 740 to the bus 712), user interface adapter 722 (for connecting a keyboard 724, mouse 726, speaker 728, microphone 732, and/or other user interface device to the bus 712), a communication adapter 734 for connecting an information handling system to a data processing network, the Internet, an Intranet, a personal area network (PAN), etc., and a display adapter 736 for connecting the bus 712 to a display device 738 and/or printer 739 (e.g., a digital printer or the like).

In addition to the hardware/software environment described above, a different aspect of the invention includes a computer-implemented method for performing the above method. As an example, this method may be implemented in the particular environment discussed above.

Such a method may be implemented, for example, by operating a computer, as embodied by a digital data processing apparatus, to execute a sequence of machine-readable instructions. These instructions may reside in various types of signal-bearing media.

Thus, this aspect of the present invention is directed to a programmed product, comprising signal-bearing media tangibly embodying a program of machine-readable instructions executable by a digital data processor incorporating the CPU 711 and hardware above, to perform the method of the invention.

This signal-bearing media may include, for example, a RAM contained within the CPU 711, as represented by the fast-access storage for example. Alternatively, the instructions may be contained in another signal-bearing media, such as a magnetic data storage diskette 800 (FIG. 8), directly or indirectly accessible by the CPU 711.

Whether contained in the diskette 800, the computer/CPU 711, or elsewhere, the instructions may be stored on a variety of machine-readable data storage media, such as DASD storage (e.g., a conventional "hard drive" or a RAID array), magnetic tape, electronic read-only memory (e.g., ROM, EPROM, or EEPROM), an optical storage device (e.g. CD-ROM, WORM, DVD, digital optical tape, etc.), paper "punch" cards, or other suitable signal-bearing media including transmission media such as digital and analog and communication links and wireless. In an illustrative embodiment of the invention, the machine-readable instructions may comprise software object code, compiled from a language such as "C", etc.

With the unique and unobvious features of the present invention, shifts in time delays, which have not been included in conventional techniques, can now be included in a timing analysis to allow design modifications prior to chip fabrication. Such shifts would be due to such factors as manufacturing abnormalities not immediately serious enough to cause a hard failure in technologies such as SOI, or to coupling between conductors.

While the invention has been described in terms of preferred embodiments, those skilled in the art will recognize that the invention can be practiced with modification within the spirit and scope of the appended claims.

What is claimed is:

1. A method for performing an analysis of a network composed of at least one path, said method comprising:
    generating a composite graph comprising K+1 copies of an original graph, said original graph represents said network with zero defects and K is a predetermined maximum number of defects on any of said at least one path, said composite graph further comprising at least one edge connecting at least one node in one of said copies to at least one node in another one of said copies; and
    performing an analysis of said network using said composite graph.

2. A method for performing fault tolerant static timing analysis for an electronic network comprising at least one path, said method comprising:
    generating a composite timing graph comprising K+1 copies of an original timing graph and at least one edge connecting at least one node in one of said copies to at least one node in another one of said copies, wherein said original timing graph represents a timing graph of said network with zero defeats and K is a predetermined maximum number of defects present on any of said at least one path; and
    performing a static timing analysis on said composite timing graph.

3. The method of claim 2, wherein said network comprises a plurality of nodes and each of said at least one path interconnects at least two of said plurality of nodes and said performing static analysis further comprises calculating, for each said node in each said path, at least one of the following:
    at least one arrival time (AT) of an input signal;
    at least one required arrival time (RAT) for said input signal; and
    at least one slack value for said input signal, wherein each said slack value is a difference between said at least one RAT and said at least one AT.

4. The method of claim 2, wherein said defects are due to one or more of the following:
    manufacturing abnormalities insufficiently serious to cause a hard failure;
    conductor coupling; and
    voltage changes in floating components.

5. The method of claim 2, wherein K=1, thereby resulting in a single-fault analysis.

6. The method of claim 2, wherein for each said i, where $0<=i<=K$, a probability is associated with said condition of i defects in said path.

7. The method of claim 2, wherein said copies j, where $1<=j<=K$, of said original timing graph include only a preselected portion of said network preselected as being susceptible to defects.

8. The method of claim 7, wherein said original timing graph includes only a preselected portion of said network preselected as being susceptible to defects.

9. A method for performing K-fault tolerant static timing analysis for an electronic network comprising at least two nodes and at least one path interconnecting said nodes, said method comprising:
    generating an original timing graph for said network, said original timing graph having at least one delay edge E, each said delay edge E having a source node and a sink node;
    generating a composite timing graph including K+1 copies of said original timing graph, where K is a predetermined maximum number of defects of a first type on any of said at least one path;
    adding a first type of defect edge for at least K of said delay edge E in said original timing graph, such that each said first type of defect edge has a delay that reflects a timing behavior of the circuit in a presence of a first type of defect from a source node of E in a $copy_i$ of said timing graph to a sink node of E in a $copy_{i+1}$ of said composite timing graph, for all values of i such that $0<=i<K$ wherein a $copy_0$ of said composite timing graph comprises a copy of said original timing graph with zero defects; and
    for each said node, calculating at least one parameter.

10. The method of claim 9, wherein said at least one parameter comprises at least one of the following:
    at least one arrival time (AT) of an input signal;
    at least one required arrival time (RAT) for said input signal; and
    an at least one slack value for said input signal, wherein each said slack value is a difference between said at least one RAT and said at least one AT.

11. A method for performing K-fault tolerant static timing analysis for an electronic network comprising at least one path, said method comprising:
    creating an original empty array representing a timing graph of said network with zero defects;
    augmenting said original empty array to create an array representing K+1 copies of said timing graph, wherein K is a predetermined maximum number of defects present on any of said at least one path; and
    performing a static timing analysis to fill in values for said augmented array, said static timing analysis including at least one edge connecting at least one node in one of said copies to at least one node in another one of said copies.

12. The method of claim 11, wherein said network comprises of a plurality of nodes and each of said at least one path interconnects at least two of said plurality of nodes and wherein said performing static timing analysis further comprises:
calculating, for each said node in each said path, at least one of the following:
at least one arrival time (AT) of said signal,
at least one required arrival time (RAT) for said signal, and
an at least one slack value for said signal, wherein each said slack value is a difference between said at least one RAT and said at least one AT.

13. A method within a data processing system for performing K-fault tolerant static timing analysis for a network comprising at least one path, each said path including at least two nodes, said method comprising:
generating a composite timing graph representing K+1 copies of an original timing graph and at least one edge connecting at least one node in one of said copies to at least one node in another one of said copies, wherein said original timing graph represents a timing graph of said network with zero defects and K is a predetermined maximum number of defects present on any of said at least one path; and
performing a static timing analysis on said composite timing graph by calculating, for each said node in each said path, at least one of the following:
at least one arrival time (AT) of an input signal,
at least one required arrival time (RAT) for said input signal,
an at least one slack value for said input signal, wherein each said slack value is a difference between said at least one RAT and said at least one AT.

14. A computer-readable medium containing a set of instructions for performing K-fault tolerant static timing analysis for a network comprising at least one path, each said path including at least two nodes, said instructions comprising:
generating a composite timing graph representing K+1 copies of an original timing graph and at least one edge connecting at least one node in said one of copies to at least one node in another one of said copies, wherein said original timing graph represents a timing graph of said network with zero defects and K is a predetermined maximum number of defects present on any of said at least one path; and
performing a static timing analysis on said composite timing graph by calculating, for each said node in each said path, at least one of the following:
at least one arrival time (AT) of an input signal,
at least one required arrival time (RAT) for said input signal,
an at least one slack value for said input signal, wherein each said slack value is a difference between said at least one RAT and said at least one AT.

15. A system containing a set of instructions for performing K-fault tolerant static timing analysis for a network comprising at least one path, each said path including at least two nodes, said instructions comprising:
generating a composite timing graph representing K+1 copies of an original timing graph and at least one edge connecting at least one node in one of said copies to at least one node in another one of said copies, wherein said original timing graph represents a timing graph of said network with zero defects and K is a predetermined maximum number of defects present on any of said at least one path; and
performing a static timing analysis on said composite timing graph by calculating, for each said node in each said path, at least one of the following:
at least one arrival time (AT) of an input signal,
at least one required arrival time (RAT) for said input signal,
an at least one slack value for said input signal, wherein each said slack value is a difference between said at least one RAT and said at least one AT.

16. A system for performing K-fault tolerant static timing analysis for a network comprising at least one path, each said path including at least two nodes, said system comprising:
means for generating a composite timing graph representing K+1 copies of an original timing graph and at least one edge connecting at least one node in one of said copies to at least one node in another one of said copies, wherein said original timing graph represents a timing graph of said network with zero defects and K is a predetermined maximum number of defects present on any of said at least one path; and
means for performing a static timing analysis on said composite timing graph by calculating, for each said node in each said path, at least one of the following:
at least one arrival time (AT) of an input signal,
at least one required arrival time (RAT) for said input signal,
an at least one slack value for said input signal, wherein each said slack value is a difference between said at least one RAT and said at least one AT.

17. An apparatus for performing K-fault tolerant static timing analysis for a network comprising at least one path, each said path including at least two nodes, said apparatus comprising:
a control unit; and
a memory unit,
wherein said control unit generates in said memory unit a composite timing graph representing K+1 copies of an original timing graph and at least one edge connecting at least one node in one of said copies to at least one node in another one of said copies, said original timing graph represents a timing graph of said network with zero defects and K is a predetermined maximum number of defects present on any of said at least one path; and said control unit further performs a static timing analysis on said composite timing graph by calculating, for each said node in each said path, at least one of the following:
at least one arrival time (AT) of an input signal,
at least one required arrival time (RAT) for said input signal, and
an at least one slack value for said input signal, wherein each said slack value is a difference between said at least one RAT and said at least one AT.

18. A method for performing a delay tolerance static timing analysis for infrequently occurring coupling delays between adjacent simultaneously-transitioning conductors in an electronic network comprising at least one path, said method comprising:
generating a composite timing graph comprising K+1 copies of an original timing graph and at least one edge connecting at least one node in one of said copies to at least one node in another one of said copies, wherein said original timing graph represents a timing graph of said network with zero coupling delays and K is a predetermined maximum number of coupling delays present on any of said at least one path; and performing a static timing analysis on said composite timing graph.

19. A method for performing a delay tolerance static timing analysis for circuit element delay variations having a bimodal distribution in an electronic network comprising at least one path, said method comprising:

generating a composite timing graph comprising K+1 copies of an original timing graph and at least one edge connecting at least one node in one of said copies to at least one node in another one of said copies, wherein said original timing graph represents a timing graph of said network with delays from a first mode of said bimodal delay distribution and K is a predetermined maximum number of delays from a second mode of said bimodal delay distribution present on any of said at least one path; and performing a static timing analysis on said composite timing graph.

20. The method of claim 9 where said original timing graph includes at least one test edge between a pair of nodes, and where a copy of said test edge is inserted between said endpoints of the said test edge in all pairs $copy_i$ and $copy_j$ of said original timing graph such that i+j=K.

21. The method of claim 20 where a defect test edge representing the behavior of the circuit in the presence of a first type of defect on said test edge, is inserted between said endpoints of the said test edge in all pairs $copy_r$ and $copy_s$ of said original timing graph such that r+s+1=K.

22. The method of claim 9 where a second type of defect edge is inserted between said source node of E in $copy_i$ of said timing graph to said sink node of E in $copy_{i+v}$ of the said composite timing graph, for all values of i such that $0<=i<=K-v$ and $v>1$, said second type of defect edge representing the behavior of the circuit in the presence of a second type of defect on edge E, said second type of defect being of lower probability than said first type of defect; and for each said node, calculating at least one parameter.

* * * * *